(12) United States Patent
Jursich et al.

(10) Patent No.: US 7,312,165 B2
(45) Date of Patent: Dec. 25, 2007

(54) CODEPOSITION OF HAFNIUM-GERMANIUM OXIDES ON SUBSTRATES USED IN OR FOR SEMICONDUCTOR DEVICES

(76) Inventors: Gregory M. Jursich, 112 Tuttle Ave., Clarendon Hills, IL (US) 60514;
Ronald S. Inman, 4540 Warsaw Ave., Lyons, IL (US) 60534

( * ) Notice: Subject to any disclaimer, the term of this patent is extended or adjusted under 35 U.S.C. 154(b) by 301 days.

(21) Appl. No.: 11/124,451

(22) Filed: May 5, 2005

(65) Prior Publication Data
US 2005/0266700 A1 Dec. 1, 2005

Related U.S. Application Data

(60) Provisional application No. 60/568,421, filed on May 5, 2004.

(51) Int. Cl.
*H01L 31/31* (2006.01)
(52) U.S. Cl. ............ 438/785; 438/685; 438/761; 438/778; 438/780; 438/783; 438/790; 257/E21.274
(58) Field of Classification Search ............ 438/761, 438/783, 785, 790
See application file for complete search history.

(56) References Cited

U.S. PATENT DOCUMENTS 6,503,561 B1 *  1/2003  Senzaki et al. ............ 427/226
2003/0168001 A1 *  9/2003  Sneh ............................ 117/86
2004/0023461 A1 *  2/2004  Ahn et al. .................. 438/287
2004/0157354 A1   8/2004  Kuriyama et al.
2004/0175882 A1   9/2004  Ahn et al.

OTHER PUBLICATIONS

"Ultralow Loss High Delta Silica Germania Planar Waveguides", R. A. Bellman, G. Bourdon, G. Alibert, A. Beguin, E. Guiot, L. B. Simpson, P. Lehuede, L. Guiziou, E. LeGuen J. Electrochem. Soc., vol. 151, Issue 8, pp. G541-G547 (2004).

"Microwave Discharge Deposition of Oxide Films at Low Temperatures", D.R. Secrist and J.D. Mackenzie, 1966, American Ceramic Society, pp. 784-788.

* cited by examiner

*Primary Examiner*—Michael Lebentritt
*Assistant Examiner*—Kyoung Lee
(74) *Attorney, Agent, or Firm*—Brandon S. Clark

(57) ABSTRACT

Methods of film deposition using metals and metal oxides. A thin film of germanium oxide and an oxide of a non-germanium metal is deposited by ALD by alternating deposition of first and second precursor compounds, wherein the first precursor compound includes a metal other than germanium, and the second precursor compound includes germanium.

23 Claims, 1 Drawing Sheet

CODEPOSITION OF HAFNIUM-GERMANIUM OXIDES ON SUBSTRATES USED IN OR FOR SEMICONDUCTOR DEVICES

CROSS-REFERENCE TO RELATED APPLICATIONS

This application claims the benefit under 35 U.S.C. § 119(e) to provisional application No. 60/568,421 filed May 5, 2004, the entire contents of which are incorporated herein by reference.

BACKGROUND

Four common ways of depositing films are by chemical vapor deposition (CVD), plasma assisted/enhanced chemical vapor deposition (PACVD/PECVD), sputtering, and atomic layer deposition (ALD).

CVD is a process of deposition onto a substrate of a vapor phase reaction product of two vapor phase precursor compounds in a reaction chamber. The substrate is typically heated in order to enhance the deposition.

PACVD/PECVD is similar to CVD except that the two precursor compounds are ionized with application of a plasma. There are many benefits to using such a method.

A first benefit to employing a plasma in deposition is to crack relatively stable molecules and encourage deposition at much lower temperatures and pressures than would be required for thermal CVD.

A second benefit to using a plasma in deposition is more subtle but of great importance. Surfaces exposed to a plasma are subject to bombardment by energetic ions, whose kinetic energy can vary from a few eV to 100's of electron volts. Ion bombardment of this nature has very significant effects on the properties of the deposited film. Increasing ion bombardment tends to make films denser and cause the film stress to become more compressive. Denser films are especially desirable for dielectric films, because such films will have higher intrinsic dielectric value and better mechanical strength to withstand lattice mismatch strain and thermal expansion film stress. While excessive compressive stress can lead to impaired reliability, the compressive stress may be favorably adjusted in PACVD/PECVD through changes in process conditions, chamber geometry, or excitation (dual frequency mixtures).

A third benefit to using a plasma in deposition is the ability to deposit dense films at temperatures hundreds of degrees less than that required for thermal densification.

A final important benefit of using a plasma in deposition is the ability to easily clean the reactor. For example, by introducing a fluorine-containing gas (e.g. CF4) and igniting a plasma, one can clean silicon, silicon nitride, or silicon dioxide from the electrodes and chamber walls (albeit with rather more difficulty). Chamber cleaning is of great practical importance, because spalling of thick films built up on the parts of a chamber will create particles which can fall onto the substrates and cause defects in circuit patterns. As a result, the yield of good circuits from the process is reduced.

One example of depositing films containing oxides of germanium by PECVD is disclosed in Ultralow Loss High Delta Silica Germania Planar Waveguides, R. A. Bellman, G. Bourdon, G. Alibert, A. Beguin, E. Guiot, L. B. Simpson, P. Lehuede, L. Guiziou, E. LeGuen J. Electrochem. Soc., Volume 151, Issue 8, pp. G541-G547 (2004).

There are also many disadvantages to using PACVD/PECVD.

First, the bombardment of surfaces with ions can lead to undesirable sputtering, i.e., the displacement of atoms from the surface into the gas phase by incoming ions. These displaced ions diffuse through the gas and can land anywhere in the chamber, including on the substrates. So, sputtering can be an important source of trace metallic contamination in PECVD films.

Second, ion bombardment is different on horizontal and vertical surfaces, so the composition and density of films can depend on the topography.

Third, plasma deposition of metallic or other highly conductive films is challenging because the deposited film tends to short out the powered electrode of a capacitive plasma reactor, or coat the dielectric window of an inductive reactor thereby shielding the chamber from the magnetic field.

Fourth, the plasma generation apparatus contributes considerably to the complexity and cost of reactors. The plasma requires one or more power supplies, each with an appropriate matching network, and electrically insulating but mechanically sound materials for isolating powered electrodes. Substrate heaters must also be electrically isolated from the plasma.

Finally, use of a plasma in deposition is not desirable in some critical applications such as gate oxide deposition due to relatively greater sensitivity to contamination and process control considerations.

An alternative to CVD and ALD is sputtering. Sputtering is a vacuum process used to deposit very thin films on substrates for a wide variety of commercial and scientific purposes. It is often performed by applying a high voltage across a low-pressure gas (usually argon at about 5 millitorr) to create a plasma. During sputtering, energized plasma ions strike a target composed of the desired coating material and cause atoms from that target to be ejected with enough energy to travel to, and bond with, the substrate.

However, sputtering has many disadvantages. Glow discharge process is not an efficient form of ion production because 95 percent of the input power is dissipated as heat. In comparison to CVD, sputtering achieves relatively low deposition rates and low deposition rates lead to incorporation of impurities into the film. Moreover, fast moving secondary electrons bombard the substrate and thereby increasing the substrate temperature. This prohibits the use of this technique for highly temperature-sensitive substrates.

One example of a film comprising germanium oxide formed by sputtering is disclosed by U.S. published patent application no. 20040157354. In that method, aluminum is etched from the aluminum/germanium film and then oxidized to form a film containing germanium oxide.

Also, Thin Solid Films 189, 293, 1990, Bull Am Ceram Soc 45, 784, (1966) discloses that films of germanium oxides are typically prepared via a two step process involving deposition of germanium metal and then oxidization of the surface using either $O_2$-containing plasma or ozone, or more directly by PACVD/PECVD.

In contrast to CVD, ALD is process in which two reactants, such as a metal or Group IV element precursor and a co-reactant, are alternatively injected in gaseous form into a reaction chamber. Typically, ALD involves only one precursor and one co-reactant. The precursor is injected into the chamber and is chemisorbed upon the substrate surface, but cannot fully react with the substrate surface in the absence of the co-reactant. Next, a purge gas is injected into the chamber to remove all the unreacted precursor, and the reaction products from the chemisorption. Subsequently, the co-reactant is injected and a gas-surface reaction takes place on the substrate between the co-reactant and the substrate and/or the first precursor chemisorbed on the substrate. The reaction product is the desired film.

Each of the sequential precursor and co-reactant is injected in dosages sufficient to saturate the substrate surface. Because the precursor adsorption and the reaction between the co-reactant and the substrate and/or precursor is limited by the saturation limit of the substrate, further growth cannot occur without additional injections of precursor and co-reactant. Hence, thickness of the desired film is controlled by the number of times the precursors are introduced into the chamber, (otherwise known as precursor cycles), rather than the deposition time as is the case for conventional CVD processes.

It should be noted that the temperature of the ALD process is maintained in a range such that neither reactant is allowed to condense into multiple molecular layers or decompose on the surface.

An example of forming a film including hafnium oxide by ALD is disclosed by U.S. published patent application no. 20040175882.

Regardless of the deposition mechanism, hafnium oxide and composite films such as hafnium aluminates, silicates, and germinates have interesting semiconductor applications, such as in the fabrication of complementary metal-oxide semiconductor devices and capacitive memory devices. Whereas codeposition of aluminate and silicate has been demonstrated, the codeposition of germinates has not been demonstrated by non-plasma chemical vapor deposition which is desirable for some semiconductor applications.

Prior to this invention, methods of vapor depositing films containing germanium oxides without using a plasma or highly reactive oxidizers, like ozone, in the deposition process were not known.

Germanium oxides in particular could be very interesting high k film materials for future semiconductor fabrication. The deposition of germanium oxides is important for other applications such as infrared optical systems, optoelectronic devices, phosphors, and optical fibers.

Further, the incorporation of germanium oxide into silicon or other metal oxides offer wide range of novel compounds, which can offer unique properties useful in these applications. Thus, one of ordinary skill in the art will recognize the need for a new method of depositing films containing germanium oxides without requiring use of a plasma or oxidation by a strong oxidant such as ozone.

SUMMARY OF THE INVENTION

This invention is directed to the field of atomic layer deposition (ALD) onto substrates used in or for semiconductor devices. More particularly, this invention is directed to deposition of germanium oxides.

The method of depositing a thin film of germanium oxide and an oxide of a non-germanium metal by atomic layer deposition (ALD) onto a substrate in an ALD chamber, according to the invention, includes the following steps. A first precursor compound is chemisorbed onto the substrate, wherein the first precursor compound includes the non-germanium metal. A first co-reactant compound is allowed to react with the first precursor compound chemisorbed onto the substrate thereby forming a thin film of an oxide of the non-germanium metal, wherein the first co-reactant compound includes oxygen. A second precursor compound is chemisorbed onto the thin film of the oxide of the non-germanium metal, wherein the second precursor compound includes germanium. A second co-reactant compound is allowed to react with the second precursor compound chemisorbed onto the thin film of an oxide of the non-germanium metal thereby forming a thin film of germanium oxide on the thin film of the oxide of the non-germanium metal.

BRIEF DESCRIPTION OF THE DRAWING

For a further understanding of the nature and objects of the present invention, reference should be made to the following detailed description, taken in conjunction with the accompanying drawing, in which like elements are given the same or analogous reference numbers and wherein.

DESCRIPTION OF PREFERRED EMBODIMENTS

Figure 1:
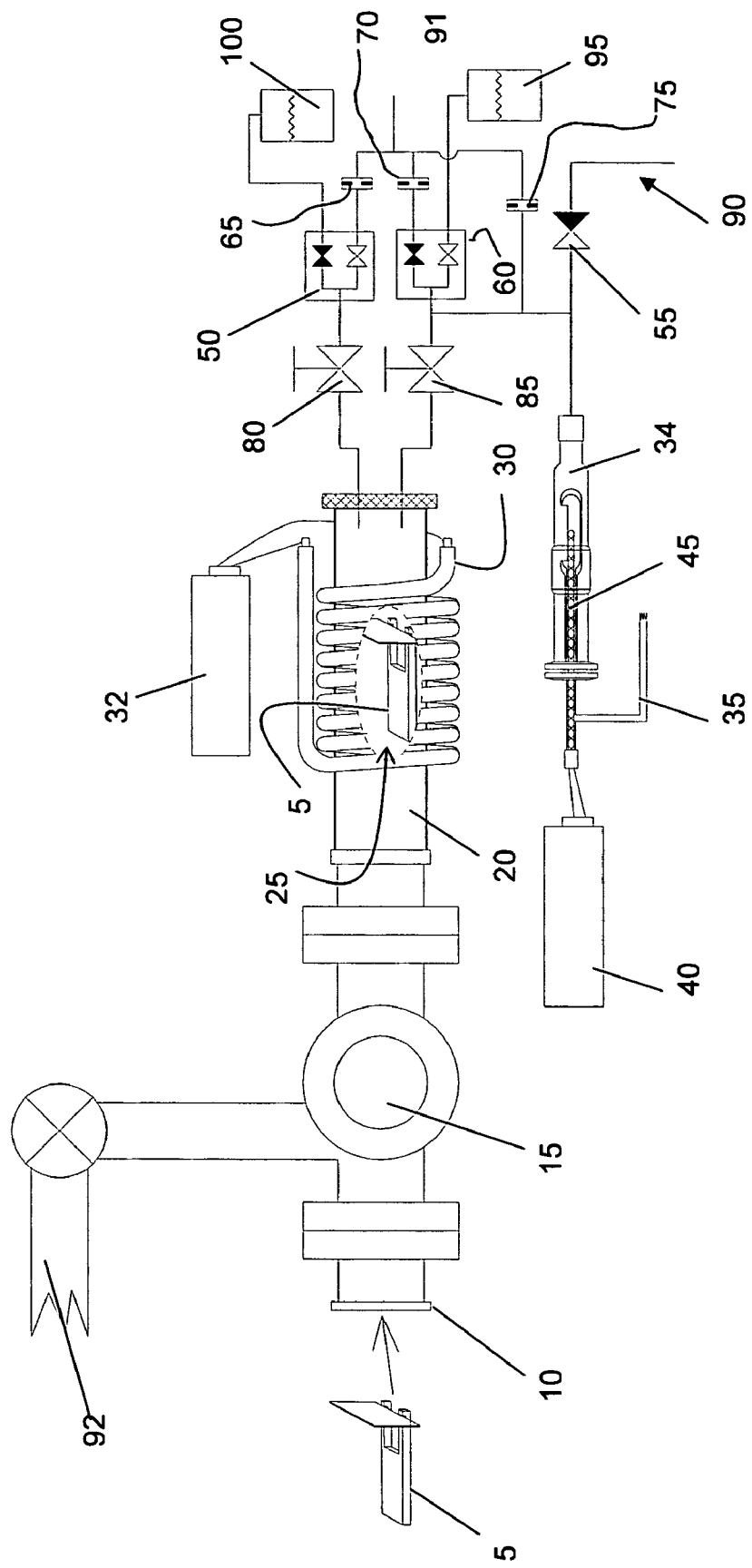
FIG. 1 illustrates the experimental setup for performing Examples I and II.

The invention is a method of depositing a film of germanium oxide, an oxide of a metal other than germanium by ALD, and the film produced thereby.

According to the method of the invention, thin films containing oxides of germanium and oxides of a metal other than germanium are formed by alternating two ALD sequences:

a) Deposition of the first oxide:
  i) introducing into a chamber containing a substrate a first precursor, which may or may not be organometallic;
  ii) purging the chamber to remove excess precursor;
  iii) introducing a first co-reactant into the chamber thereby forming a first type of thin layer of an oxide of a metal corresponding to the first precursor (germanium or the non-germanium metal as the case may be); and
  iv) purging the chamber to remove excess first co-reagent and any reaction byproducts
b) Deposition of the second oxide:
  i) introducing into the chamber a second precursor, which may or may not be organometallic;
  ii) purging the chamber to remove excess second precursor;
  iii) introducing into the chamber a second co-reactant thereby forming a second type of thin film (on top of the first type of thin film) an oxide of the metal corresponding to the second precursor; and
  iv) purging the chamber to remove excess second co-reagent and any reaction byproducts.

It should be noted that while the first and second co-reagents may or may not be the same, preferably they are the same.

When the above sequence associated with the germanium-containing precursor is performed, a thin film of germanium oxide ($GeO_2$) is formed.

Those of ordinary skill in the art will recognize that the precursors and co-reactants are introduced into the chamber by injecting them in pulses, i.e., injection over a particular time duration. The combination of the two above sequences constitutes a cycle. The cycles are repeatedly performed until a film of the two oxides of a desired thickness is achieved.

One of the organometallic precursors contains germanium while the other organometallic precursor contains a metal other than germanium. Preferred non-germanium metals include zirconium, niobium, molybdenum, ruthenium, iridium, hafnium, lead, tin, tantalum, titanium, tungsten, osmium, vanadium, chromium, rhenium, and rhodium, and columbium (niobium). More preferably, the non-germanium metal is titanium, hafnium, lead, tin, or zirconium. Most preferably, the non-germanium metal is hafnium.

It is believed that these metals, or for that matter any metal, may be codeposited as an oxide with germanium oxide according to the invention, so long as the precursor containing the metal other than germanium generally has the following properties: high surface reactivity/high sticking coefficient, self-saturating, no unwanted by-products, suitable deposition temperature, and high volatility/suitable vapor pressure.

One suitable type of a germanium-containing precursor includes germanium tetraalkoxides of the formula: $Ge(OR^1)(OR^2)(OR^3)(OR^4)$, wherein each of the groups $R^1$, $R^2$, $R^3$, and $R^4$ is selected from:
  a) one of the formula $(CH_2)_nCH_3$, wherein n ranges from 0 to 3;
  b) one of the formula $C(CH_3)_3$; or
  c) one of the formula $CH(CH_3)_2$;

and wherein each of the $R^1$, $R^2$, $R^3$, and $R^4$ groups may be the same or different. Preferred germanium tetraalkoxide precursors include: tetrakis methoxide germanium, tetrakis ethoxide germanium, and tetrakis isopropoxide germanium, all of which are available from ESEL TechTra Inc., (www.labkorea.com) in Incheon, Korea.

Another suitable type of a germanium-containing precursor includes germanium alkylamines of the formula: $Ge(NR^1R^2)(NR^3R^4)(NR^5R^6)$, wherein each of the groups $R^1$, $R^2$, $R^3$, $R^4$, $R^5$ and $R^6$ is selected from:
  a) one of the formula $(CH_2)_nCH_3$, wherein n ranges from 0 to 3;
  b) one of the formula $C(CH_3)_3$; or
  c) one of the formula $CH(CH_3)_2$;

and wherein each of the $R^1$, $R^2$, $R^3$, $R^4$, $R^5$ and $R^6$ groups may be the same or different. Preferred germanium alkylamino precursors of this type, available from ESEL TechTra Inc., (www.labkorea.com) in Incheon, Korea, include tetrakis dimethylamino germanium, tetrakis diethylamino germanium, germanium ethoxide, germanium methoxide, germanium isopropoxide, tetrakis ethylmethylamino germanium. An especially preferred germanium alkylamino precursor is tetrakis dimethylamino germanium.

One suitable type of a non-germanium precursor includes alkylamines of the formula $M(NR)_m$, wherein M is one of zirconium, niobium, molybdenum, ruthenium, iridium, hafnium, lead, tin, tantalum, titanium, tungsten, osmium, vanadium, chromium, rhenium, and rhodium, and niobium, wherein each R is selected from:
  a) one of the formula $(CH_2)_nCH_3$, wherein n ranges from 0 to 3;
  b) one of the formula $C(CH_3)_3$; or
  c) one of the formula $CH(CH_3)_2$;

and wherein each R may be the same or different, and m is the valence number of the metal M. Preferred metals M are titanium, hafnium, lead, tin, or zirconium.

Another suitable type of non-germanium precursors includes alkoxides of the formula $MR_m$, wherein M is one of zirconium, niobium, molybdenum, ruthenium, iridium, hafnium, lead, tin, tantalum, titanium, tungsten, osmium, vanadium, chromium, rhenium, and rhodium, and niobium, each R is selected from:
  a) one of the formula $O(CH_2)_nCH_3$, wherein n ranges from 0 to 3, and m is the valence number of the metal M;
  b) one of the formula $OC(CH_3)_3$; or
  c) one of the formula $OCH(CH_3)_2$;

and wherein each R is the same or different. Preferred metals M are titanium, hafnium, lead, tin, or zirconium.

Another suitable type of non-germanium precursors includes diketonates of the formula $MR''_m$, wherein M is a metal and is one of zirconium, niobium, molybdenum, ruthenium, iridium, hafnium, lead, tin, tantalum, titanium, tungsten, osmium, vanadium, chromium, rhenium, and rhodium, and niobium, m is the valence number of the metal M, R" is of the formula:

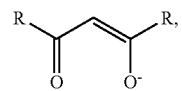

either R is the same or different alkyl, each R is the same or different, and m is the valence number of the metal M. Of these diketonates, the alkyls include alkyls of the formula:
  a) $(CH_2)_nCH_3$, wherein n ranges from 0 to 3;
  b) $C(CH_3)_3$; or
  c) $CH(CH_3)_2$.

Of these diketonates, preferred metals M are titanium, hafnium, lead, tin, or zirconium. Suitable diketones include: Lanthanum tris (2, 2, 6, 6-tetramethyl-3, 5-heptanedionate), Yttrium tris (2, 2, 6, 6-tetramethyl-3, 5-heptanedionate), Cobalt bis (2, 2, 6, 6-tetramethyl-3, 5-heptanedionate), Cerium tetra (2, 2, 6, 6-tetramethyl-3, 5-heptanedionate), Praseodymium tris (2, 2, 6, 6-tetramethyl-3, 5-heptanedionate), Samarium bis (2, 2, 6, 6-tetramethyl-3, 5-heptanedionate), Aluminum tris (2, 2, 6, 6-tetramethyl-3, 5-heptanedionate), Erbium tris (2, 2, 6, 6-tetramethyl-3, 5-heptanedionate), Scandium tris (2, 2, 6, 6-tetramethyl-3, 5-heptanedionate), Gadolium tris (2, 2, 6, 6-tetramethyl-3, 5-heptanedionate), Manganese bis (2, 2, 6, 6-tetramethyl-3, 5-heptanedionate), Calcium bis (2, 2, 6, 6-tetramethyl-3, 5-heptanedionate), and Copper bis (2, 2, 6, 6-tetramethyl-3, 5-heptanedionate), all of which are available from Epichem (formerly Inorgtech). Other suitable diketonates include lead bis (2, 2, 6, 6-tetramethyl-3, 5-heptanedionate) or zirconium tetrakis (2, 2, 6, 6-tetramethyl-3, 5-heptanedionate, tin tetrakis (2, 2, 6, 6-tetramethyl-3, 5-heptanedionate, zirconium tetrakis (2, 4-pentanedionate), and titanium tetrakis (2, 4-pentanedionate). Preferred diketonates include: lead bis (2, 2, 6, 6-tetramethyl-3, 5-heptanedionate) or zirconium tetrakis (2, 2, 6, 6-tetramethyl-3, 5-heptanedionate, tin tetrakis (2, 2, 6, 6-tetramethyl-3, 5-heptanedionate, zirconium tetrakis (2, 4-pentanedionate), and titanium tetrakis (2, 4-pentanedionate).

Particular examples of non-germanium precursors, all of which are available from Sigma-Aldrich include: hafnium tert-butoxide, tetrakisdiethylamino hafnium, tetrakisdimethylamino hafnium, tetrakisethylmethylamino hafnium, bis-diethylamino bis-diisopropylamino titanium, tetrakisdiethylamino titanium, tetrakisdimethylamino titanium, tetrakisethylmethylamino titanium, titanium (IV) tert-butoxide, tetrakisdiethylamino zirconium, tetrakisdimethylamino zirconium, tetrakisethylmethylamino zirconium, zirconium (IV) tert-butoxide, lead bis (2, 2, 6, 6-tetramethyl-3, 5-heptanedionate), and zirconium tetrakis (2, 2, 6, 6-tetramethyl-3, 5-heptanedionate).

Other examples of non-germanium containing precursors, all of which are available from ESEL TechTra Inc., (www.labkorea.com) in Incheon, Korea include: tetraethyllead, triethyllead neopentoxide, tetrakisdiethylamino tin, tetrakisdimethylamino tin, tetrakisethylmethylamino tin, tin isopropoxide, tin tert-butoxide, bis (2, 2, 6, 6,-tetramethyl-3, 5-heptanedionate) oxotitanium, bis (2, 2, 6, 6-tetramethyl-3, 5-heptanedionato) titanium diisopropoxide, titanium (IV) isopropoxide, and tetrakis (2, 2, 6, 6-tetramethyl-3, 5-heptandionato) zirconium.

Particularly preferred non-germanium containing precursors include: tetrakisdiethylamino hafnium, tetrakisdimethylamino titanium, and tetrakisdimethylamino zirconium.

Suitable substrates include those containing silicon, SiGe, $SiO_2$, $Al_2O_3$

The first and second co-reactants may be the same or different. Preferably, the first and second co-reactants are the same. Suitable coreactants capable of hydrolyzing the precursors include alcohols (ROH) and silanols (RSiOH). R is most commonly methyl, ethyl, isopropyl or t-butyl; however, other alky groups can be possible. The larger alkyl groups (C4 or greater) would be less advantageous because steric hinderance from such large alkyl groups could impede the surface reaction. Suitable coreactants capable of oxidizing the precursors at suitable deposition temperatures include $H_2O$, $O_2$, $O_3$, and the nitrogen oxides. Preferably, one or both of the first and second co-reactants is $H_2O$. However, the preferred choice of coreactant depends upon the film requirements. For example, if some small carbon content is acceptable in film and hydroxyl groups are not acceptable, then $H_2O$ is the preferred coreactant, whereas if trace carbon is not tolerable in the film then the use of $O_2$, $O_3$, and the nitrogen oxides as a coreactant is preferable.

In between the pulse of one of the precursors and the associated co-reactant, the chamber is purged. While this may be accomplished by applying a vacuum to the chamber, preferably an inert purge gas is injected into the chamber in order to sweep out remaining precursors, co-reactants, undesirable gases, reaction products, etc. Preferably, the purge gas is nitrogen or argon. Preferably, the nitrogen or argon purge gas is introduced in between each introduction of precursor and co-reactant, but it is not essential.

Suitable substrate temperatures range from about 150° C. to about 500° C. Suitable temperatures of the precursor's vapors range from about 20° C. to about 200° C., while suitable pressures of the precursor vapors range from about 100 millitorr and higher. Suitable reactor temperatures range from about 100° C. to about 500° C., while suitable reactor pressures range from about 0.1 to about 10 torr. While optimal pulse times will depend on the specific manifold design and deposition chamber geometry, they typically range from about 1 to 100 seconds. Those of ordinary skill in the art will appreciate that the pulse time may be varied in order to suit the precursor concentration, manifold design, and deposition chamber geometry employed. The desired film thickness will determine the number of suitable pulses for each precursor, but typically will range from about 10 to about 500 cycles. One of ordinary skill in the art will understand that one cycle consists of the combined deposition of the Ge oxide and the non-Ge oxide.

Surprising results related to deposition of germanium oxide using ALD were achieved using this invention.

First, it was found that germanium oxide will not deposit directly onto silicon or a native oxide layer of silicon. One of ordinary skill in the art will understand that native oxide grows on the silicon surface without any deliberate attempt to do so. For example, exposure to air at ambient conditions will result in the growth of native oxide on a silicon surface. But in some cases silicon dioxide is a desired film that is grown using typical deposition processes like CVD. Such grown films would not be known as "native oxides". Without being bound by any theory, we believe that the germanium precursor requires a metal oxide site to attach to and further the film growth.

Second, we have found that, under reactor conditions in which a hafnium precursor may be deposited by ALD, the germanium oxide cannot be deposited unless the hafnium precursor is present as well. We believe that other metal oxides such as oxide of one of zirconium, niobium, molybdenum, ruthenium, iridium, hafnium, lead, tin, tantalum, titanium, tungsten, osmium, vanadium, chromium, rhenium, and rhodium, and columbium (niobium) will act in the same way as hafnium in this regard. Preferably, when hafnium is used, films of $GeO_2$ and $HfO_2$ may be deposited having a Hf:Ge:O molar ratio of 1.3:1.0:4.3, which is near stoichiometric. However, the method of the invention may be performed to produce a thin film of germanium oxide and an oxide of a non-germanium metal at stoichiometric ratio of germanium: non-germanium metal: oxygen ranging from about 1:50 to about 50:1.

Third, we have also surprisingly found that the vapor deposition of $GeO_2$ films is not possible using reactions of $GeCl_4$ or Ge alkoxide precursors with moisture as is commonly done for other metal oxides, for example, aluminum and hafnium oxides.

The method of the invention may be performed to produce a high k thin film material used in CMOS devices, micro-capacitors, such as deep trench capacitors used in DRAM devices, or other microelectronic circuits. More preferably, such a high k thin film material is used in the formation of gate oxides in CMOS devices.

EXAMPLES

As illustrated in FIG. 1, the hot wall reactor, which was used in the examples, was equipped with a computer-controlled manifold that can vaporize precursor source materials and deliver the vaporized precursor and co-reactant into the reactor in a sequential pulse mode. After each precursor or co-reactant pulse injected into the hot wall reactor, there is a purge of inert gas through the reactor to remove residual vapor phase constituents while maintaining an adsorbed layer on the substrate surface.

In operation, a substrate holder 5 is inserted through substrate introduction port 10 past viewport 15 and quartz tube 20 and into into chamber 25. Portions of the drawing depicting the quartz tube 20 are broken away in order to show the chamber 25. The quartz tube is surrounded by a coil heater 30 whose temperature is controlled by temperature controller 32.

The germanium-containing precursor is contained within source holder 34. The temperature of the interior of the source holder 34 is maintained at a desired level by temperature controller 40 and thermocouple 45 in order to produce vaporized germanium precursor at a sufficiently desirable vapor pressure. A source of carrier gas is connected to conduit 35 for carrying the vaporized germanium precursor out of the source holder 34.

A source of the precursor not containing germanium 95 is in fluid communication with pneumatically operated switching valve 50 and valve 85 in order to introduce that precursor into the chamber 25.

Similarly a source of coreactant 100, in this case moisture, for reaction with both precursors is in fluid communication with pneumatically operated switching valve 60 and valve 85 in order to introduce the coreactant into the chamber 25.

A source of purge gas, in this case nitrogen, is connected to conduit 91 and is in fluid communication with critical orifices 65, 70 and 75, switching valves 50 and 55, and valves 80 and 85 in order to purge the device of the coreactant and the non-germanium precursor.

A source of vacuum is applied to conduit 90 and the pneumatically operated on/off valve 55 is manipulated into the on position in order to divert a flow of the germanium precursor from the source holder 34 through the valve 55 and be vented through conduit 90.

The apertures of the critical orifices 50, 60, and 75, the vacuum pressure of the source of vacuum applied to conduits 90 and 92, and the degree to which the valves 80 and 85 are selected such that the device operates according to the following description.

When on/off valve 55 is manipulated by a PC (not depicted) via a pneumatic control device (not depicted) into the off position and switching valves 50 and 60 are manipulated by the PC into positions preventing flows of the non-germanium precursor and the coreactant through the device, the vaporized germanium precursor flows through valve 85 and into chamber 25 where it is chemisorbed onto the substrate When the on/off valve 55 is in the on position, and switching valves 50 and 60 are manipulated into a position preventing flow of the non-germanium precursor and the coreactant through the device, and the switching valve 60 is manipulated into a position allowing a flow of the non-germanium precursor through the device, a flow of nitrogen purges the chamber.

When the on/off valve 55 is in the on position, the switching valve 50 is manipulated into a position preventing a flow of the coreactant through the device, and the switching valve 60 is manipulated into a position allowing the non-germanium precursor to flow there through, the vapor portion of the non-germanium precursor flows through switching valve 60 and valve 85 into chamber 25 where it is chemisorbed onto the substrate.

The period of time, in which switching valves 50 and 60, and the on/off valve 55 are in one position, or the other determines a pulse length.

In accordance with the invention, the precursors are codeposited onto the substrates.

Experimental Conditions:
  Si Substrate Temperature=300° C.
  HfCl$_4$ Source Temperature=120° C.
  Ge(OEt)$_4$ Source Temperature=23° C.
  Average Reactor Pressure=0.5 Torr ALD Pulsing Sequence for Examples:
  Ge Precursor pulse 4 s
  N$_2$ purge 8 s
  H$_2$O pulse 0.8 s
  N$_2$ purge 12 s
  Hf Precursor Pulse 4 s
  N$_2$ purge 8 s
  H$_2$O pulse 0.8 s
  N$_2$ purge 12 s The above experimental conditions were used to deposit hafnium and germanium oxides using a hafnium tetrachloride, HfCl$_4$, precursor and a germanium tetraethoxide, Ge(OEt)$_4$ precursor. The resulting film obtained on a silicon substrate had a thickness of about 570 Angstrom after 150 cycles. The elemental analysis of this 570 Angstrom film was found to have a Hf:Ge:O molar ratio of 1.3:1.0:4.3, which is near stoichiometric. When these conditions were used again with 300 cycles, the resulting film had a thickness of about 1,000 Angstrom. In another example, a tetrakis diethylamino hafnium precursor was used instead of hafnium chloride. In this case, after 100 cycles of pulses as described in previous figure, a ~80 Angstrom thick film is formed on silicon.

These examples along with others are summarized in Table 1. The source temperature of precursors, are designated by Hf or Ge and substrate temperature indicated by Si. The film thickness is given in Angstroms.

The presence and type of film was determined by making spectral reflectometer measurements after film deposition. Here, a broadband visible light source is reflected off the deposition film at normal incidence angle and the spectral intensity is measured as a function of wavelength. Depending on index of refraction of the film and other optical properties, the film thickness can be determined down to several angstroms thickness. In some case, film on the substrate is also examined by Energy Dispersive X-ray Spectroscopy. Here, a focused electron bean within a Scanning Electron Microscope impinges the substrate surface and as a result X-ray fluorescence for the sample irradiated is recorded and analyzed. In this technique relative amounts of elements and hence stoichiometry of the film can be determined.

TABLE 1

Summary of Precursor Tests

| Hf/Ge | None | GeCl4 | Ge(OEt)4 |
|---|---|---|---|
| None | — | 100 cycles<br>Si 23-300° C.<br>GeCl4 130° C.<br>No deposition could be confirmed | 150 cycles<br>Si 300° C.<br>Ge(OEt)4 21° C.<br>No deposition could be confirmed |
| HfCl4 | 100 cycles<br>Si 300° C.<br>HfCl4 125° C.<br>250 A film | 150 cycles<br>Si 250-300° C.<br>HfCl4 120-130° C.<br>GeCl4 23° C.<br>No deposition could be confirmed | 100-150 cycles<br>Si 300-320° C.<br>HfCl4 130° C.<br>Ge(OEt)4 23° C.<br>85 A/100 cycle<br>570 A/150 cycle |
| Hf(DEA)4 | 150 cycles<br>Si 300° C.<br>Hf(DEA)4 80° C.<br>170 A film | | 300 cycles<br>Si 300° C.<br>Hf(DEA)4 80° C.<br>Ge(OEt)4 23° C.<br>1000 A film/300 cycle |

In each, films containing GeO$_2$ without presence of the HfO$_2$ were not detected. It is believed that GeO$_2$ cannot be deposited alone by ALD, but can be co-deposited with HfO$_2$. The elemental analysis of one film generated on Si is indicated below in Table 2. In this case, the precursors were hafnium chloride and germanium ethoxide in the manner indicated in Table 1 and FIG. 1.

TABLE 2

Elemental Composition of Film on Si

| Element | Weight Percent | Mole Ratio |
|---|---|---|
| O | 18.6 | 4.3 |
| Ge | 19.5 | 1.0 |
| Hf | 61.9 | 1.3 |

Preferred processes and apparatus for practicing the present invention have been described. It will be understood and readily apparent to the skilled artisan that many changes and modifications may be made to the above-described embodiments without departing from the spirit and the scope of the present invention. The foregoing is illustrative only and that other embodiments of the integrated processes and apparatus may be employed without departing from the true scope of the invention defined in the following claims.

What is claimed is:

1. A method of depositing a thin film of germanium oxide and an oxide of a non-germanium metal by atomic layer deposition (ALD) onto a substrate in an ALD chamber, comprising the steps of:
   a) chemisorbing a first precursor compound onto the substrate, the first precursor compound including the non-germanium metal;
   b) allowing a first co-reactant compound to react with the first precursor compound chemisorbed onto the substrate thereby forming a thin film of an oxide of the non-germanium metal, the first co-reactant compound including oxygen;
   c) chemisorbing a second precursor compound onto the thin film of the oxide of the non-germanium metal, wherein the second precursor compound comprises at least one member selected from the group consisting of:
      1) a germanium tetraalkoxide of the formula Ge(OR1)(OR2)(OR3)(OR4), wherein each of the groups R1, R2, R3, and R4 is selected from:
         i) the formula $(CH2)nCH3$, wherein n ranges from 0 to 3;
         ii) the formula $C(CH3)3$; or
         iii) the formula $CH(CH3)2$;
         and wherein each of the R1, R2, R3, and R4 groups may be the same or different, and
      2) a germanium alkylamine of the formula Ge(NR1R2)(NR3R4)(NR5R6), wherein each of the groups R1, R2, R3, R4, R5 and R6 is selected from:
         i) the formula $(CH2)nCH3$, wherein n ranges from 0 to 3;
         ii) the formula $C(CH3)3$; or
         iii) the formula $CH(CH3)2$;
         and wherein each of the R1, R2, R3, R4, R5 and R6 groups may be the same or different, and
   d) allowing a second co-reactant compound to react with the second precursor compound chemisorbed onto the thin film of an oxide of the non-germanium metal thereby forming a thin film of germanium oxide on the thin film of the oxide of the non-germanium metal.

2. The method of claim 1, wherein the non-germanium metal is selected from the group consisting of:
   a) zirconium;
   b) niobium;
   c) molybdenum;
   d) ruthenium
   e) iridium;
   f) hafnium;
   g) lead;
   h) tin;
   i) tantalum;
   j) titanium;
   k) tungsten;
   l) osmium;
   m) vanadium;
   n) chromium;
   o) rhenium;
   p) rhodium; and
   q) columbium.

3. The method of claim 1, wherein the non-germanium metal is selected from the group consisting of:
   a) titanium;
   b) hafnium;
   c) lead;
   d) tin; or
   e) zirconium.

4. The method of claim 1, wherein the non-germanium metal is hafnium.

5. The method of claim 1 wherein the second precursor is tetrakis methoxide germanium, tetrakis ethoxide germanium, or tetrakis isopropoxide germanium.

6. The method of claim 1, wherein the second precursor is tetrakis ethylmethylamino germanium, tetrakis dimethylamino germanium, or tetrakis diethylamino germanium.

7. The method of claim 1, wherein the first precursor is an alkylamine of the formula $M(NR)m$, wherein:
   M is one of zirconium, niobium, molybdenum, ruthenium, iridium, hafnium, lead, tin, tantalum, titanium, tungsten, osmium, vanadium, chromium, rhenium, and rhodium and niobium;
   each R is selected from:
      a) the formula $(CH2)nCH3$, wherein n ranges from 0 to 3;
      b) the formula $C(CH3)3$; or
      c) the formula $CH(CH3)2$;
   each R may be the same or different; and
   m is the valence number of the metal M.

8. The method of claim 7, wherein the metal M is selected from the group consisting of:
   a) titanium;
   b) hafnium; and
   c) zirconium.

9. The method of claim 7, wherein m is 4 and each R is CH3.

10. The method of claim 7, wherein m is 4 and each R is CH2CH3.

11. The method of claim 9, wherein the metal M is selected from the group consisting of:
    a) titanium;
    b) hafnium; and
    c) zirconium.

12. The method of claim 11, wherein the metal M is selected from the group consisting of:
    a) titanium;
    b) hafnium; and
    c) zirconium.

13. The method of claim 1, wherein first precursor is an alkoxide of the formula $MRm$, wherein:
    M is one of zirconium, niobium, molybdenum, ruthenium, iridium, hafnium, lead, tin, tantalum, titanium, tungsten, osmium, vanadium, chromium, rhenium, and rhodium and niobium;
    each R is selected from:
       a) the formula $O(CH2)nCH3$, wherein n ranges from 0 to 3, and m is the valence number of the metal M;
       b) the formula $OC(CH3)3$; or
       c) the formula $OCH(CH3)2$; and
    each R is the same or different.

14. The method of claim 13, wherein the metal M is selected from the group consisting of:
    a) titanium;
    b) hafnium;
    c) lead;
    d) tin; and
    e) zirconium.

15. The method of claim 14, wherein each R is OC(CH3)3.

16. The method of claim 1, wherein the first precursor is a diketonate of the formula MR"m, wherein:
M is a metal and is one of zirconium, niobium, molybdenum, ruthenium, iridium, hafnium, lead, tin, tantalum, titanium, tungsten, osmium, vanadium, chromium, rhenium, and rhodium, and niobium, m is the valence number of the metal M;
R" is of the formula

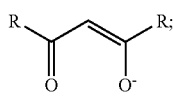

either R is the same or different alkyl or alkoxide;
each R" is the same or different; and
m is the valence number of the metal M.

17. The method of claim 16, wherein the alkyls are those of the formula:
a) (CH2)nCH3, wherein n ranges from 0 to 3;
b) C(CH3)3; or
c) CH(CH3)2.

18. The method of claim 16, wherein the alkoxides are those of the formula:
a) O(CH2)nCH3, wherein n ranges from 0 to 3;
b) OC(CH3)3; or
c) OCH(CH3)2.

19. The method of claim 16, wherein the metal M is selected from the group consisting of:
a) titanium;
b) hafnium;
c) lead;
d) tin; and
e) zirconium.

20. The method of claim 16, wherein the first precursor is lead bis(2,2,6,6-tetramethyl-3,5-heptanedionate), zirconium tetrakis(2,2,6,6-tetramethyl-3,5-heptanedionate), tin tetrakis (2,2,6,6-tetramethyl-3,5-heptanedionate), zirconium tetrakis (2,4-pentanedionate), and titanium tetrakis(2,4-pentanedionate).

21. The method of claim 1, wherein the first and second coreactant compounds are H2O.

22. The method of claim 1, wherein the first and second coreactant compounds are O2, O3, or a nitrogen oxide.

23. The method of claim 1, wherein a combination of the thin film of germanium oxide on the thin film of the oxide of the non-germanium metal consists essentially of germanium, the non-germanium metal, and oxygen.

* * * * *